United States Patent
Lee

(10) Patent No.: US 11,910,580 B2
(45) Date of Patent: Feb. 20, 2024

(54) POWER CONVERSION DEVICE

(71) Applicant: LG INNOTEK CO., LTD., Seoul (KR)

(72) Inventor: Yong Joo Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 161 days.

(21) Appl. No.: 17/415,859

(22) PCT Filed: Dec. 26, 2019

(86) PCT No.: PCT/KR2019/018502
§ 371 (c)(1),
(2) Date: Jun. 18, 2021

(87) PCT Pub. No.: WO2020/138968
PCT Pub. Date: Jul. 2, 2020

(65) Prior Publication Data
US 2022/0087078 A1    Mar. 17, 2022

(30) Foreign Application Priority Data
Dec. 26, 2018    (KR) ........................ 10-2018-0168993

(51) Int. Cl.
*H05K 7/20*    (2006.01)

(52) U.S. Cl.
CPC ......... *H05K 7/20927* (2013.01); *H05K 7/209* (2013.01); *H05K 7/20254* (2013.01); *H05K 7/20336* (2013.01)

(58) Field of Classification Search
CPC ........... H05K 7/20927; H05K 7/20254; H05K 7/20336; H05K 7/209; H05K 7/20936; H05K 1/0203; H05K 2201/066; H05K 2201/064; H05K 1/0204; H02M 3/003; H02M 3/04; H01L 23/427; H01L 23/3672; H01L 23/3736; H01L 21/4882; H01L 23/367; H01L 2023/405; F28D 15/0275; F28D 15/02; F28D 15/04; F28D 2015/0216; G06F 1/20; G06F 2200/201
See application file for complete search history.

(56) References Cited

U.S. PATENT DOCUMENTS

| | | | |
|---|---|---|---|
| 6,351,381 | B1 | 2/2002 | Bilski et al. |
| 8,861,203 | B2 * | 10/2014 | Fang ................... H01L 23/4338 165/185 |
| 2005/0067144 | A1 * | 3/2005 | Chou .................. F28D 15/0275 257/E23.099 |

(Continued)

FOREIGN PATENT DOCUMENTS

| CN | 103348138 A | 10/2013 |
|---|---|---|
| CN | 206294058 U | 6/2017 |

(Continued)

*Primary Examiner* — Mandeep S Buttar
(74) *Attorney, Agent, or Firm* — Birch, Stewart, Kolasch & Birch, LLP

(57) ABSTRACT

A power conversion device includes: a housing; and a cover coupled to the housing, the cover includes a plate portion, a heat conduction portion coupled to the plate portion, and a refrigerant pipe, the plate portion includes a first groove in which the refrigerant pipe is disposed, and the depth of one end of the first groove is smaller than that of the other end.

20 Claims, 6 Drawing Sheets

(56) References Cited

U.S. PATENT DOCUMENTS

| | | | |
|---|---|---|---|
| 2007/0051498 A1* | 3/2007 | Xia | F28F 1/22 165/100 |
| 2007/0051501 A1* | 3/2007 | Wu | H01L 23/427 257/E23.084 |
| 2007/0151711 A1* | 7/2007 | Chen | H01L 23/427 29/890.032 |
| 2008/0247136 A1* | 10/2008 | Peng | H01L 23/467 257/E23.099 |
| 2009/0073659 A1 | 3/2009 | Peng | |
| 2009/0236626 A1* | 9/2009 | Xiao | F28D 15/0275 257/E33.001 |
| 2009/0260782 A1* | 10/2009 | Whitney | B21D 53/02 29/890.032 |
| 2011/0203773 A1 | 8/2011 | Teraki et al. | |
| 2014/0182817 A1* | 7/2014 | Yu | F28D 15/0275 165/104.21 |
| 2014/0233174 A1* | 8/2014 | Demange | G06F 1/20 165/104.21 |
| 2014/0293541 A1 | 10/2014 | Opila et al. | |
| 2015/0062820 A1* | 3/2015 | Lam | H01L 23/473 361/718 |
| 2016/0268655 A1* | 9/2016 | Takamatsu | H01M 10/625 |
| 2016/0295679 A1* | 10/2016 | Yeini | H05K 7/20336 |
| 2016/0316589 A1* | 10/2016 | Silvennoinen | H01L 23/373 |
| 2018/0062347 A1* | 3/2018 | Hodges | H01S 5/02438 |
| 2018/0279508 A1 | 9/2018 | Roan et al. | |
| 2018/0303010 A1 | 10/2018 | Kerner | |
| 2018/0368291 A1 | 12/2018 | Theander | |
| 2019/0120896 A1* | 4/2019 | Chen | H05K 3/00 |
| 2019/0204015 A1* | 7/2019 | Huang | F28D 15/0266 |

FOREIGN PATENT DOCUMENTS

| | | |
|---|---|---|
| JP | 2004-273632 A | 9/2004 |
| KR | 10-2015-0064153 A | 6/2015 |

* cited by examiner

POWER CONVERSION DEVICE

CROSS REFERENCE TO RELATED APPLICATIONS

This application is the National Phase of PCT/KR2019/01.8502 filed on Dec. 26, 2019, which claims priority under 35 U.S.C. § 119(a) to Patent Application No. 10-2018-0168993 filed in the Republic of Korea on Dec. 26, 2018, all of which are hereby expressly incorporated by reference into the present application.

TECHNICAL FIELD

The present embodiment relates to a power conversion device.

DESCRIPTION OF RELATED ART

The following description provides background information on the present embodiment, and does not describe the prior art.

Engine electric devices (starting devices, ignition devices, charging devices) and lighting devices are generally used as electric devices of automobiles, but in recent years, most systems including chassis electric devices are becoming electrified as vehicles are more electronically controlled.

Various electrical equipment such as lamps, audio, heaters, air conditioners, and the like installed in automobiles are supplied with power from the battery when the vehicle is stopped, and power from the generator when driving, and at this time, the power generation capacity of the 14V power system is used as the normal power supply voltage.

Recently, with the development of the information technology industry, various new technologies (motor-type power steering, Internet, and the like) aiming to increase the convenience of automobiles are being adopted into vehicles, and the development of new technologies capable of maximally utilizing the current automotive system is expected to be continued in the future.

Regardless of the soft or hard type, the hybrid electric vehicle (HEY) is equipped with a power conversion device to supply 12V electric load. In addition, the power conversion device, which serves as a generator (alternator) of a general gasoline vehicle, is supplying a voltage of 12V for electric load by stepping down the high voltage of the main battery (usually a high voltage battery of 144V or higher).

The outer appearance of the power conversion device can be formed by a housing. A plurality of electronic components for driving may be disposed inside the housing. For example, a transformer for voltage regulation and an inductor for obtaining inductance may be disposed inside the housing. In addition, switching elements such as transistors in the conversion circuit may be disposed on the printed circuit board.

The electronic components may generate heat by driving. Since the temperature exceeding the standard causes a product failure, heat dissipation is an essential factor to be considered for securing the quality of the power conversion device.

Heat dissipation of the housing may be achieved through heat radiating fins disposed on the outer surface of the housing. The heat radiating fins are formed by being protruded from the outer surface of the housing, whereby heat generated in the housing can be radiated to the outside.

However, there is a problem in that heat dissipation of the power conversion device is not sufficiently achieved with only the heat radiating fins when considering the fact that the amount of heat generated by each electronic component is different from each other and that a plurality of electronic components are arranged in a narrow space of the power conversion device.

SUMMARY OF THE INVENTION

The present embodiment is to provide a power conversion device capable of improving heat dissipation efficiency by improving the structure in the housing.

In one embodiment, the power conversion device comprises: a housing; and a cover coupled to the housing, wherein the cover includes a plate portion, a heat conduction portion coupled with the plate portion, and a refrigerant pipe, and wherein the plate portion includes a first groove in which the refrigerant pipe is disposed, and the depth of one end of the first groove is smaller than that of the other end.

The heat conduction portion may include a second groove in which a portion of the refrigerant pipe is disposed.

The first groove may include a bottom surface, and the bottom surface may include an inclined region.

The plate portion may include a third groove in which a heat conduction portion is disposed.

The third groove includes a bottom surface, and the bottom surface may include an inclined region.

The bottom surface of the second groove and the bottom surface of the first groove may have the same slope.

The heat conduction portion may include regions in which the thicknesses of one end and the other end are different from each other.

The lower surface of the heat conduction portion may be parallel to the lower surface of the plate portion.

The refrigerant pipe may be disposed to be inclined with respect to the lower surface of the plate portion.

The bottom surface of the first groove includes a first region including one end of the first groove and a second region including the other end of the first groove, wherein the first region includes an inclined area, and the second region may have a region parallel to a lower surface of the plate portion.

According to the present invention, since heat radiation is uniformly accomplished in a wide area by a refrigerant pipe and a heat radiating plate, there is an advantage in that the heat radiation efficiency of the power conversion device is enhanced.

DETAILED DESCRIPTION

Hereinafter, embodiments of the present invention will be described in detail with reference to the accompanying drawings.

However, the technical idea of the present invention is not limited to some embodiments to be described, but may be implemented in various forms, and if it is within the scope of the technical idea of the present invention, one or more of the components may be selected, combined, and substituted between the embodiments for use.

In addition, terms (including technical and scientific terms) used in the embodiments of the present invention are generally understood by those of ordinary skill in the technical field to which the present invention belongs unless explicitly defined and described, and it can be interpreted as a meaning, and terms generally used, such as terms defined in a dictionary, may be interpreted in consideration of the meaning in the context of the related technology.

In addition, terms used in the embodiments of the present invention are for describing the embodiments and are not intended to limit the present invention. In the present specification, the form may include the plural form unless specifically stated in the phrase, and when described as "at least one r more than one) of A and B and C", it may contain one or more of all combinations that can be combined with A, B, and C.

In addition, terms such as first, second, A, B, (a), (h), and the like may be used in describing the components of the embodiment of the present invention.

These terms are only for distinguishing the component from other components, and are not limited to the nature, order, or sequence or the like of the component by the term.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when it is described as being formed or disposed in the "top (upper side) or bottom (lower side)" of each component, the top (upper side) or bottom (lower side) not only includes a case when the two components are in direct contact with each other but also includes a case where one or more other components are formed or disposed between the two components. In addition, when expressed as "top (upper side) or bottom (lower side)", the meaning of not only an upward direction but also a downward direction based on one component may be included.

Figure 1:
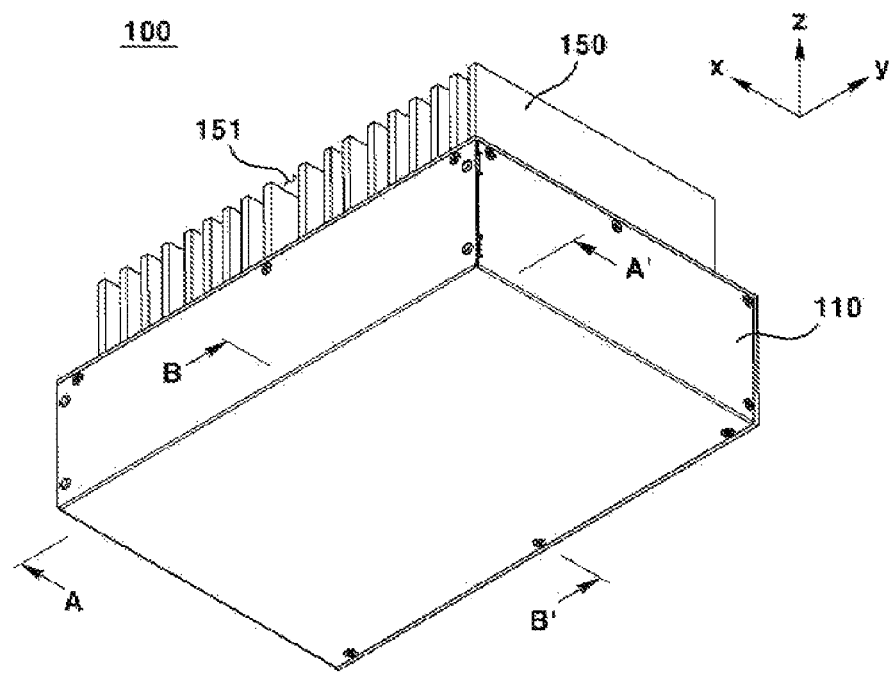
FIG. 1 is a perspective view of a power conversion device according to an embodiment of the present invention.
Figure 2:
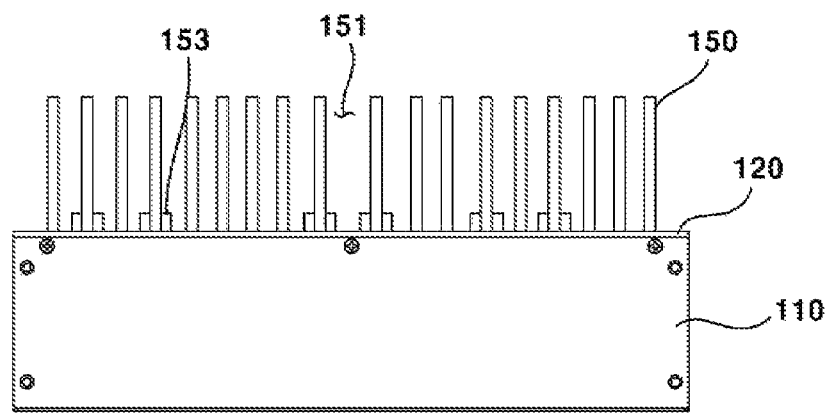
FIG. 2 is a cross-sectional view illustrating a side view of a power conversion device according to an embodiment of the present invention.

FIG. 1 is a perspective view of a power conversion device according to an embodiment of the present invention, and FIG. 2 is a cross-sectional view illustrating a side view of a power conversion device according to an embodiment of the present invention.

Referring to FIG. 1, the outer appearance of a power conversion device (converter) 100 according to an embodiment of the present invention may be formed by a housing 110. The housing 110 may be formed in a substantially rectangular parallelepiped shape. A space in which a plurality of electronic components is disposed may be formed in the housing 110.

A cover 120 may be coupled to an upper surface of the housing 110. By the coupling of the cover 120, the inner space of the housing 110 can be shielded. The cover 120 and the housing 110 may be coupled to each other by having a rib and a groove in an edge region. Unlike this, the cover 120 may be screw-coupled to the housing 110.

In the present embodiment, the housing 110 and the cover 120 are coupled to be separated from each other as an example, but unlike this, the housing 110 and the cover 120 may be integrally formed.

A heat radiating fin 150 being protruded from the upper surface may be provided on an upper surface of the power conversion device 100. The heat radiating fin 150 may be protruded upward from the upper surface of the cover 120. The heat radiating fin 150 may be formed in a plate shape. Due to the heat radiating fin 150, the cross-sectional area of the outer surface of the power conversion device 100 may be increased, thereby increasing heat dissipation efficiency. That is, due to the driving of the power conversion device 100, heat generated in the power conversion device 100 may be radiated to the outside through the heat radiating fin 150. A fan (not shown) for discharging air toward the heat radiating fin 150 may be disposed in a region adjacent to the heat radiating fin 150.

The heat radiating tin 150 may be provided in plural and disposed to be spaced apart from each other. A gap 151 may be formed between adjacent heat radiating fins 150 among the plurality of heat radiating fins 150. Therefore, heat can be easily radiated to the outside through the heat radiating fins 150, FIG. 3 is an exploded perspective view of a power conversion device according to an embodiment of the present invention.

Figure 3:
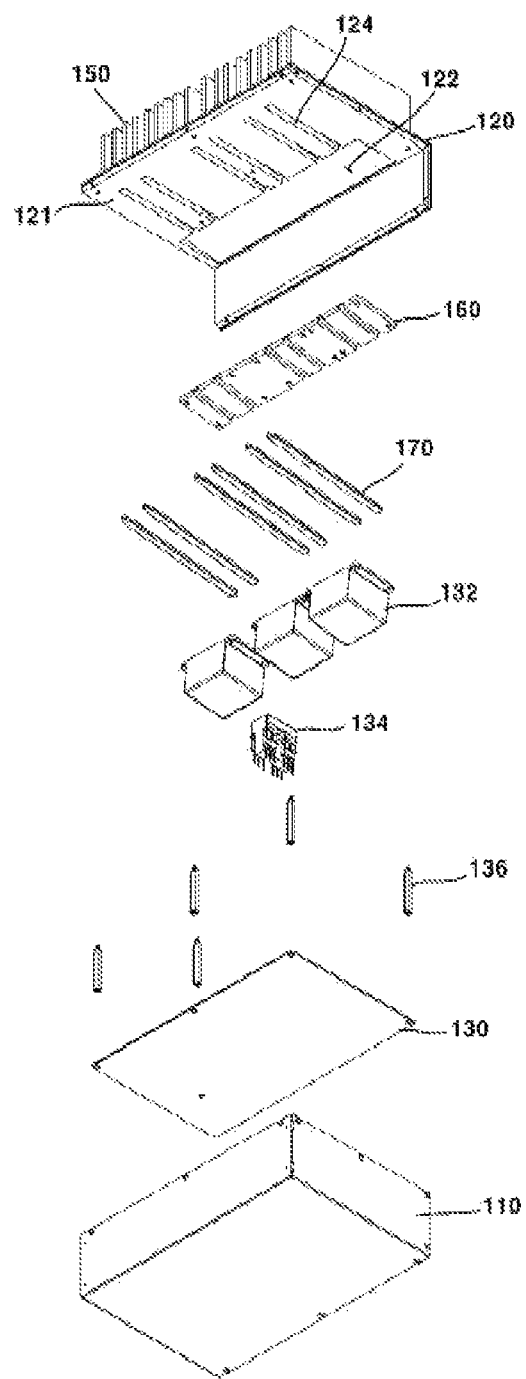
FIG. 3 is an exploded perspective view of a power conversion device according to an embodiment of the present invention.

Referring to FIG. 3, a printed circuit board 130, electronic components 132 and 134, a refrigerant pipe 170, and a heat conduction portion 160 may be disposed inside the power conversion device 100 according to an embodiment of the present invention. The printed circuit board 130, the electronic components 132 and 134, the refrigerant pipe 170, and the heat conduction portion 160 may be disposed in the inner space of the housing 110 or the inner surface of the cover 120.

The printed circuit board 130 may be formed in a plate shape. The printed circuit board 130 may be disposed inside the housing 110. One or more electronic components for driving the power conversion device 100 may be mounted or coupled to the printed circuit board 130. The printed circuit board 130 may be fixed inside the housing 110 through a separate screw 136. One end of the screw 136 may be coupled to the inner surface of the housing 110 or other components, and the other end of the screw 136 may be coupled to the printed circuit board 130 to fix the printed circuit board 130 to an inner space.

Examples of the electronic components 132 and 134 may include an inductor 132 for obtaining inductance, a transformer for voltage regulation, and a field effect transistor (FET) element 134 for amplifying voltage. The electronic components 132 and 134 may generate heat by the operation of the power conversion device 100. The electronic components 132 and 134 may be electrically or physically coupled to the printed circuit board 130.

The inductor 132 may be provided in plural. The inductor 132 may be disposed between the printed circuit board 130 and the cover 120. The inductor 132 may be disposed on an upper surface of the printed circuit board 130. The inductor 132 may be in contact with a lower surface of the cover 120 or an inner surface of the housing 110. The inductor 132 may be in contact with a surface of an inner surface of the housing 110 or the cover 120 that faces a region where the heat radiating fin 150 is formed.

Hereinafter, a heat dissipation structure of the power conversion device 100 according to an embodiment of the present invention will be described.

Figure 4:
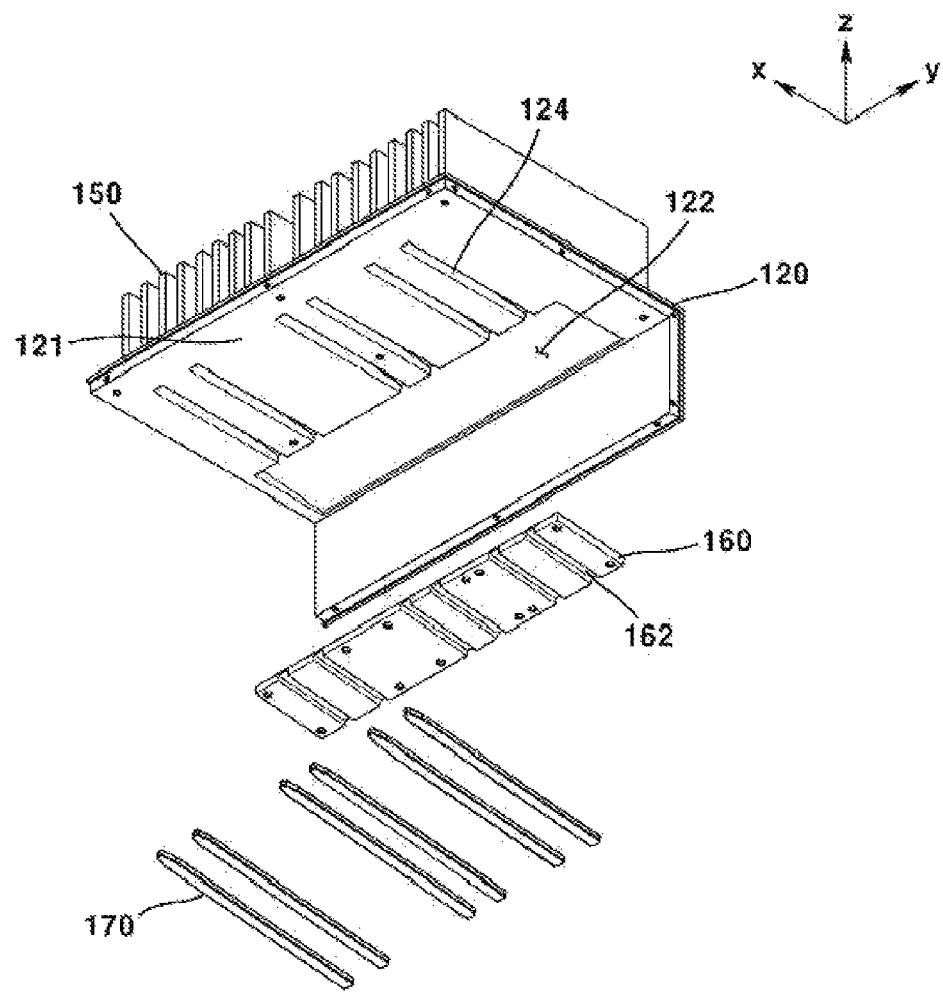
FIG. 4 is an exploded perspective view of a heat dissipation structure for a power conversion device according to an embodiment of the present invention.
Figure 5:
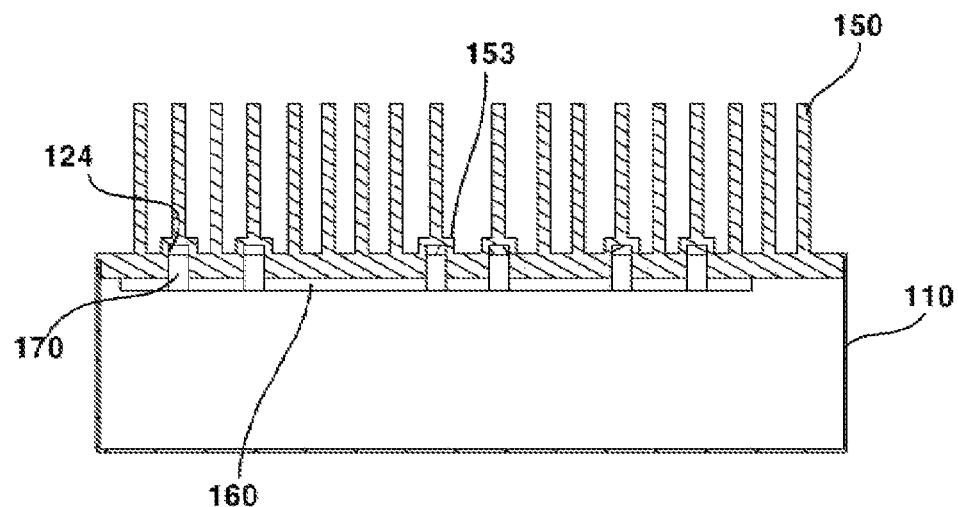
FIG. 5 is a cross-sectional view taken along line A-A' of FIG. 1.
Figure 6:
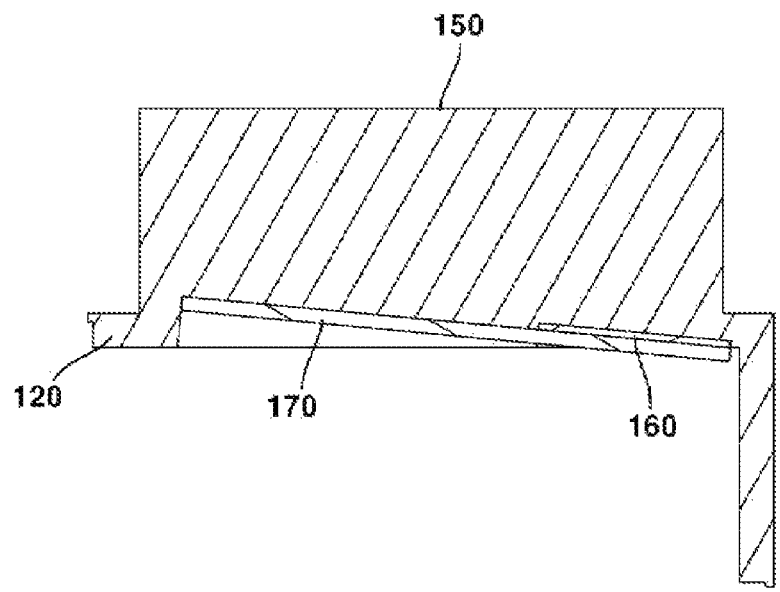
FIG. 6 is a cross-sectional view taken along line B-B' of FIG. 1.
Figure 7:
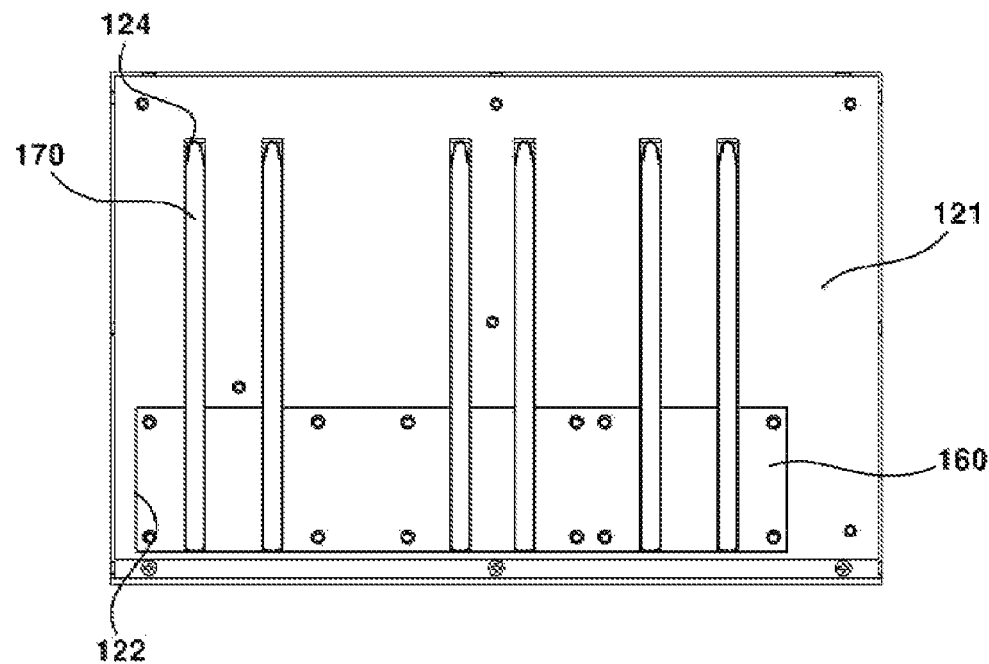
FIG. 7 is a cross-sectional view showing a lower surface of a cover according to an embodiment of the present invention.

FIG. 4 is an exploded perspective view of a heat dissipation structure for a power conversion device according to an embodiment of the present invention, FIG. 5 is a cross-sectional view taken along line A-A' of FIG. 1, FIG. 6 is a cross-sectional view taken along line B-B' of FIG. 1, and FIG. 7 is a cross-sectional view showing a lower surface of a cover according to an embodiment of the present invention.

Referring to FIGS. 1 to 7, the cover 120 may include a plate portion 121, a heat conduction portion 160 coupled to the plate portion 121, and a refrigerant pipe 170.

The heat conduction portion 160 and the refrigerant pipe 170 may be coupled or disposed on the inner surface of the housing 110 or the cover 120, that is, the inner surface of the plate portion 121.

In detail, the heat conduction portion 160 may be formed in a plate shape and may be disposed above the electronic component. The heat conduction portion 160 may be disposed above the inductor 132. The lower surface of the heat conduction portion 160 may be in contact with the upper surface of the inductor 132. The heat conduction portion 160 may be disposed so that at least a portion of the inductor 132 is overlapped with the inductor 132 in the upper and lower directions. The heat conduction portion 160 may be formed of a metal material. For example, the material of the heat conduction portion 160 may be copper (Cu), In summary, the heat conduction portion 160 may be disposed to be overlapped with the heating element disposed in the power conversion device 100 in the upper and lower directions (Z direction).

The heat conduction portion 160 may be soldered to the lower surface of the cover 120.

A third groove 122 may be formed in a region where the heat conduction portion 160 is disposed among the lower surfaces of the cover 120 to be recessed upward from other regions. The cross-sectional shape of the third groove 122 may correspond to the cross-sectional shape of the heat conduction portion 160.

The third groove 122 may include a bottom surface, and the bottom surface of the third groove 122 may include an inclined region. That is, the bottom surface of the third groove 122 may form an inclined surface. The inclined surface of the third groove 122 may be formed in a shape in which the length to the lower surface of the plate portion 121 increases in a positive direction with respect to the X-axis in FIG. 4. In other words, the inclined surface of the third groove 122 may be formed in a shape in which the length of the inclined surface of the plate portion 121 up to the lower surface of the plate portion 121 decreases as it travels toward the edge region of the plate portion 121.

Meanwhile, the lower surface of the heat conduction portion 160 may be disposed parallel to the lower surface of the plate portion 121. In addition, since an inclined surface is formed on the bottom surface of the third groove 122, the heat conduction portion 160 may include regions having different thicknesses.

The upper surface of the heat conduction portion 160 may be disposed to be inclined with respect to the cover 120. For example, when the upper surface of the cover 120 and the lower surface of the housing 110 are disposed in parallel, the upper surface of the heat conduction portion 160 can be disposed not parallel to the upper surface of the cover 120 the lower surface of the housing 110. The upper surface of the heat conduction portion 160 may be disposed not parallel to the printed circuit board 130. The upper surface of the heat conduction portion 160 may include regions having different linear distances from the upper surface of the cover 120. For example, the upper surface of the heat conduction portion 160 may include regions having different linear lengths to the upper surface of the heat radiating fin 150.

When a region of the heat conduction portion 160 close to the side surface of the housing 110 referred to as one end of the heat conduction portion 160, and when a region opposite to the one end and close to the center of the housing 110 is referred to as the other end of the heat conduction portion 160, the heat conduction portion 160 may be disposed such that the linear length from the one end up to the upper surface of the cover 120 is longer than a linear length from the other end up to the upper surface of the cover 120.

In some cases, a protruded portion (not shown) protruding upward to accommodate at least a partial region of the heat conduction portion 160 may be formed on the upper surface of the cover 120. At this time, a partial region of the heat conduction portion 160 may be accommodated in the protruded portion.

When the plurality of heat radiating fins 150 are disposed to be spaced apart in a first direction, the heat conduction portion 160, the heat conduction portion 160 may have a rectangular cross-sectional shape in which a length in a first direction is longer than a length in a second direction perpendicular to the first direction.

The lower surface of the heat conduction portion 160 may be in contact with the upper surface of the inductor 132. Due to this, heat generated from the inductor 132 may be conducted to the heat conduction portion 160.

A refrigerant pipe 170 may be disposed under the heat conduction portion 160. A flow path for accommodating a refrigerant may be formed inside the refrigerant pipe 170. The refrigerant may flow through the flow path.

The refrigerant pipe 170 may be coupled to a lower surface of the heat conduction portion 160 or a lower surface of the plate portion 121. A second groove 162 may be formed on a lower surface of the heat conduction portion 160 to be recessed more upward than other regions. The second groove 162 may accommodate at least a portion of the refrigerant pipe 170. The width of the second groove 162 may correspond to the width of the refrigerant pipe 170.

In addition, a first groove 124 in which the refrigerant pipe 170 is disposed may be formed on a lower surface of the plate portion 121. The first groove 124 may have a depth of one end smaller than that of the other end. In detail, when a region on the end side of the first groove 124 disposed relatively close to the third groove 122 is referred to as one end of the first groove 124, and when a region on the end side facing one end is referred to as the other end of the first groove 124, the first groove 124 may be formed such that the depth of one end is smaller than the depth of the other end.

Meanwhile, the bottom surface of the first groove 124 and the bottom surface of the second groove 162 may have the same slope, That is, a bottom surface of the second groove 162 may also have an inclined surface having the same slope as that of the first groove 124.

For this reason, the bottom surface of the first groove 124 may include an inclined area. The bottom surface of the first groove 124 may form an inclined surface. In other words, the bottom surface of the first groove 124 may be formed with an inclined surface so that the length up to the lower surface of the plate portion 121 increases as it travels from one end of the first groove 124 to the other end.

Meanwhile, the length direction of the first groove 124 and the length direction of the heat radiating fin 150 may correspond to each other.

The refrigerant pipe 170 may be provided in plurality and disposed to be spaced apart from each other. Accordingly, the second groove 162 may also be disposed in plural on the lower surface of the heat conduction portion 160. That is, the number of the second groove 162 and the refrigerant pipe 170 may correspond to each other on a one-to-one basis.

The refrigerant pipe 170 may be disposed in an area being overlapped with the inductor 132 in the upper and lower directions. The lower surface of the refrigerant pipe 170 may be in contact with the lower surface of the inductor 132.

The refrigerant pipe 170 may be disposed to be overlapped with at least some of the heat radiating fins 150 in the upper and lower directions. The thickness of the refrigerant pipe 170 may be thicker than the thickness of the heat radiating fin 150. Accordingly, when the cover 120 is viewed from the bottom, both edge regions of the refrigerant pipe 170 may be protruded toward the outside the heat radiating fin 150.

The length direction of the heat radiating fin 150 and the length direction of the refrigerant pipe 170 may correspond to each other.

The refrigerant pipe 170 may be disposed to be inclined with respect to the lower surface of the plate portion 121. For example, the refrigerant pipe 170 may be disposed not parallel to the upper surface of the plate portion 121 or the lower surface of the housing 110. The refrigerant pipe 170 may be disposed not parallel to the printed circuit board 130. The refrigerant pipe 170 may include regions having different linear distances from the lower surface of the housing 110. The refrigerant pipe 170 may include regions in which linear distances to the upper end of the heat radiating fin 150 are different from each other.

In detail, when a region relatively close to the region being in contact with the inverter 132 among both ends of the refrigerant pipe 170 is referred to as one end of the refrigerant pipe 170, and when a region facing the one end is referred to as the other end of the refrigerant pipe 170, the refrigerant pipe 170 may be disposed to be inclined so that the other end is positioned higher than one end. Here, being positioned high may be understood as that the straight line distance of the one end from the bottom surface of the housing 110 is shorter than that of the other end.

Due to the inclined arrangement of the refrigerant pipe 170, a protruded portion 153 may be formed on the upper surface of the cover 120 being protruded further upward than the other regions to accommodate a portion of the refrigerant pipe 170 inside. For example, the protruded portion 153 may accommodate a partial region of the other end of the refrigerant pipe 170 that is disposed relatively high. The protruded portion 153 may be disposed to be overlapped with a partial region on the lower side of the heat radiating fin 150 in the upper and lower directions. A groove for accommodating a portion of the refrigerant pipe 170 may be formed in a partial region of the lower side of the heat radiating fin 150 in which the refrigerant pipe 170 is disposed. The upper surface of the protruded portion 153 may have a shape inclined with respect to the upper surface of the cover 120.

In other words, a region in which the protruded portion 153 is formed among the thicknesses of the heat radiating fin 150 may be formed to be thicker than that of other regions.

According to the above configuration, when heat is generated from the electronic components 132 and 134, the generated heat can be conducted upwards by contact between the heat conduction portion 160 and the electronic components 132 and 134. Since the arrangement direction of the plurality of heat radiating fins 150 corresponds to the length direction of the heat conduction portion 160, heat may be uniformly conducted to the plurality of heat radiating fins 150 through the heat conduction portion 160.

In addition, generated heat may be radiated by contact between the electronic components 132 and 134 and the refrigerant pipe 170. At this time, a liquid refrigerant flows to one end of the refrigerant pipe 170 having a relatively low height, and some of the liquid refrigerant is vaporized by heat transferred from the electronic components 132 and 134 so that the vaporized refrigerant may flow to the other end of the refrigerant pipe 170 having a relatively high height. The vaporized refrigerant is cooled through the heat radiating fin 150 and liquefied again, so that it may flow back to one end of the refrigerant pipe 170.

Therefore, according to the present embodiment, since heat radiation is uniformly performed in a wide area by the refrigerant pipe 170 and the heat conduction portion 160, there is an advantage in that the heat radiation efficiency of the power conversion device 100 is improved.

Figure 8:
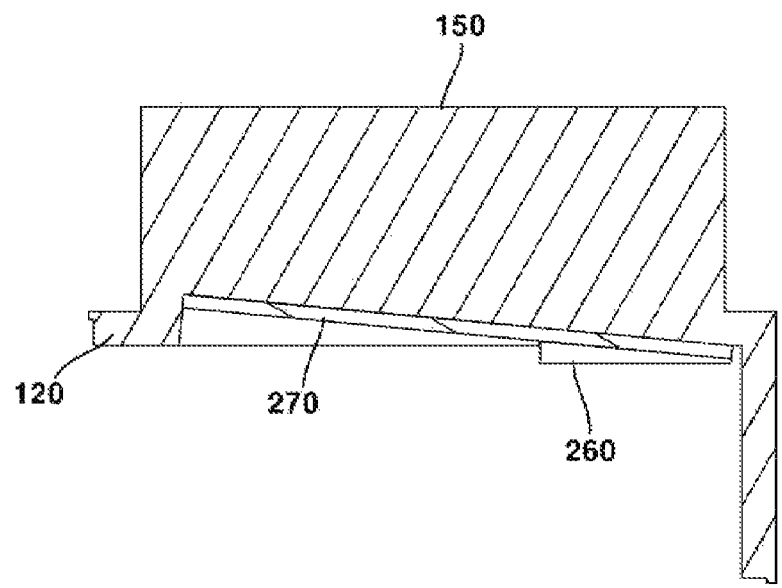
FIG. 8 is a cross-sectional view of a heat dissipation structure in a power conversion device according to a second embodiment of the present invention.

FIG. 8 is a cross-sectional view of a heat dissipation structure in a power conversion device according to a second embodiment of the present invention.

This embodiment is the same as the first embodiment except that there is a difference in the arrangement structure of the heat sink and the refrigerant pipe. Therefore, hereinafter, only the characteristic parts of the present embodiment will be described, and the first embodiment will be used for the remaining parts.

Referring to FIG. 8, in the power conversion device according to the present embodiment, a heat sink 260 disposed on the upper surfaces of the electronic components 132 and 134 and a refrigerant pipe 270 disposed above the heat sink 260 may be provided. In this embodiment, the refrigerant pipe 270 may be disposed above the heat sink 260. Accordingly, heat generated from the electronic components 132 and 134 may be conducted to the refrigerant pipe 270 through the heat sink 260.

In addition, in the present embodiment, the upper and lower surfaces the heat sink 260 may be disposed in parallel to the upper surfaces of the electronic components 132 and 134, the cover 120 and the bottom surface of the housing 110.

Figure 9:
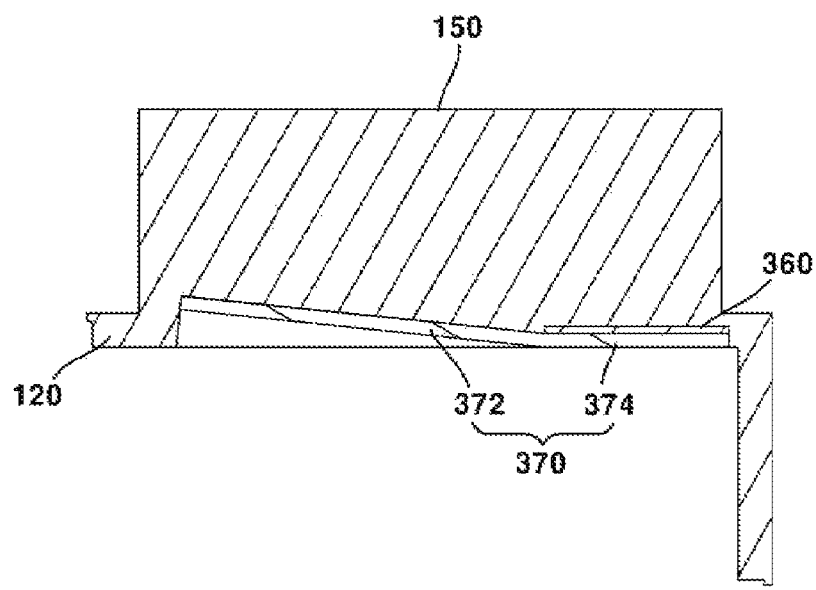
FIG. 9 is a cross-sectional view of a heat dissipation structure in a power conversion device according to a third embodiment of the present invention.

FIG. 9 is a cross-sectional view of a heat dissipation structure in a power conversion device according to a third embodiment of the present invention.

This embodiment is the same as the first embodiment except that there is a difference in the arrangement structure of the heat sink and the refrigerant pipe. Therefore, hereinafter, only the characteristic parts of the present embodiment will be described, and the first embodiment will be used for the remaining parts.

Referring to FIG. 9, inside the power conversion device according to the present embodiment, a refrigerant pipe 370 disposed on the upper surfaces of the electronic components 132 and 134 and a heat sink 360 disposed above the refrigerant pipe 370 may be included. The refrigerant pipe 370 may be coupled into a receiving groove formed on a lower surface of the heat sink 360.

The refrigerant pipe 370 according to the present embodiment may include a flat portion 374 and an inclined portion 372 being extended from one end of the flat portion 374 and disposed to be inclined.

The flat portion 374 may be disposed under the heat sink 360. The lower surface of the flat portion 374 may be in contact with the upper surfaces of the electronic components 132 and 134.

Figure 10:
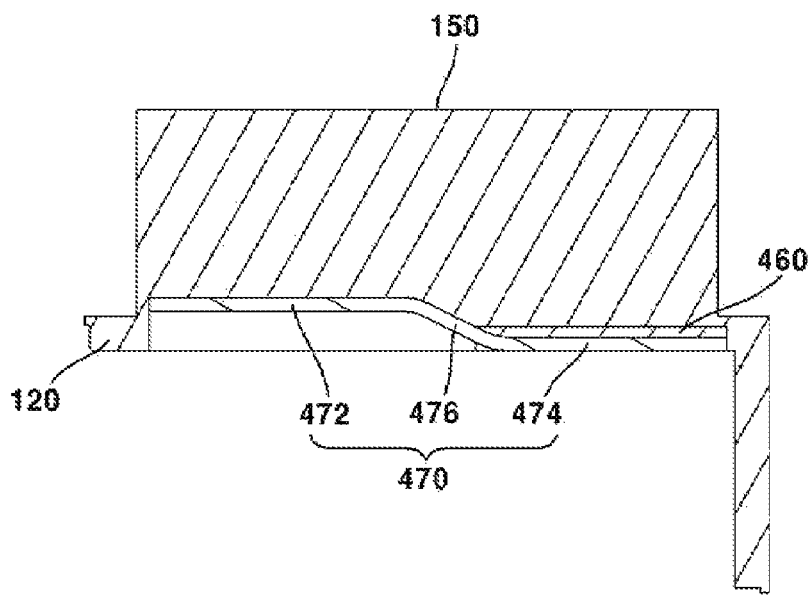
FIG. 10 is a cross-sectional view of a heat dissipation structure in a power conversion device according to a fourth embodiment of the present invention.

One end of the inclined portion 372 may be coupled to one end of the flat portion 374 to be extended toward the other end. At this time, the inclined portion 372 may be disposed to be inclined as a whole so that the height of the other end is higher than the height of one end. The flat portion 374 and the inclined portion 372 may be formed as one body, so that a flow path through which the refrigerant flows may be formed. The inclined portion 372 may be formed by bending a partial region of the refrigerant pipe 370, FIG. 10 is a cross-sectional view of a heat dissipation structure in a power conversion device according to a fourth embodiment of the present invention.

This embodiment is the same as the first embodiment except that there is a difference in the arrangement structure of the heat sink and the refrigerant pipe. Therefore, hereinafter, only the characteristic parts of the present embodiment will be described, and the first embodiment will be used for the remaining parts, Referring to FIG. 10, in the power conversion device according to the present embodiment, a heat sink 460 disposed on the upper surfaces of the electronic components 132 and 134 and a refrigerant pipe 470 partially coupled to the lower surface of the heat sink 460 may be included.

The refrigerant pipe 470 may include: a first horizontal portion 474 coupled to a lower surface of the heat sink 460; a second horizontal portion 472 parallel to the first horizontal portion 474 and disposed to be stepped with respect to the first horizontal portion 474; and an inclined portion 476 having one end coupled to the first horizontal portion 474 and the other end coupled to the second horizontal portion 472 to inclinedly connect the first horizontal portion 474 and the second horizontal portion 472.

The first horizontal portion 474, the second horizontal portion 472, and the inclined portion 476 may be formed as one body, so that a flow path through which the refrigerant flows may be formed.

The electronic components 132 and 134 may be in contact with a lower surface of the first horizontal portion 474. Accordingly, the refrigerant in the first horizontal portion 474 is vaporized by the heat generated by the electronic components 132 and 134, and the vaporized refrigerant may pass through the inclined portion 476 to flow to the second horizontal portion 472.

The inclined portion 476 may be formed by bending a portion of a bar-shaped refrigerant pipe.

In other words, the bottom surface of the first groove 124 in which the refrigerant pipe 470 is disposed may include a first region including one end of the first groove 124 and a second area including the other end of the first groove 124.

In addition, the first region may include an inclined region, and the second region may have a region parallel to the lower surface of the plate portion 121. Here, one end of the refrigerant pipe 470 may be a region relatively close to the third groove in which the heat conduction portion 160 is disposed, and the other end of the refrigerant pipe 470 may be a region opposite to the one end.

In the above, even though all the components constituting the embodiments of the present invention are described as being combined into one or operating in combination, the present invention is not necessarily limited to these embodiments. That is, within the scope of the object of the present invention, all the constituent elements may be selectively combined and operated in one or more. In addition, the terms 'include', 'consist of', or 'have' described above mean that the corresponding component can be present unless otherwise stated, so other components are excluded. Rather, it should be interpreted as being able to further include other components. All terms, including technical or scientific terms, have the same meaning as commonly understood by one of ordinary skill in the art, unless otherwise defined. Terms commonly used, such as terms defined in the dictionary, should be interpreted as being consistent with the meaning of the context of the related technology, and are not interpreted as ideal or excessively formal meanings unless explicitly defined in the present invention.

The above description is merely illustrative of the technical idea of the present invention, and those of ordinary skill in the art to which the present invention pertains will be able to make various modifications and variations without departing from the essential characteristics of the present invention. Accordingly, the embodiments disclosed in the present invention are not intended to limit the technical idea of the present invention, but to explain the technical idea, and the scope of the technical idea of the present invention is not limited by these embodiments. The scope of protection of the present invention should be interpreted by the following claims, and all technical ideas within the scope equivalent thereto should be construed as being included in the scope of the present invention.

The invention claimed is:

1. A power conversion device comprising: a housing; and a cover coupled to the housing, wherein the cover includes: a plate portion; a heat conduction portion coupled with the plate portion; and a refrigerant pipe, wherein the plate portion includes a first groove in which the refrigerant pipe is disposed, and a depth of a first end of the first groove is smaller than that of a second end of the first groove, wherein the plate portion includes a third groove in which a heat conduction portion is disposed, and wherein the third groove includes a bottom surface, and the bottom surface includes an inclined region.

2. The power conversion device according to claim 1, wherein the heat conduction portion includes a second groove in which a portion of the refrigerant pipe is disposed.

3. The power conversion device according to claim 1, wherein the first groove includes a bottom surface, and the bottom surface includes an inclined region.

4. The power conversion device according to claim 2, wherein a bottom surface of the second groove and a bottom surface of the first groove have the same slope.

5. The power conversion device according to claim 1, wherein the heat conduction portion includes regions in which the thicknesses of a first end and a second end are different from each other.

6. The power conversion device according to claim 1, wherein a lower surface of the heat conduction portion is parallel to a lower surface of the plate portion.

7. The power conversion device according to claim 1, wherein the refrigerant pipe is disposed to be inclined with respect to a lower surface of the plate portion.

8. The power conversion device according to claim 1, wherein a bottom surface of the first groove includes a first region including the first end of the first groove and a second region including the second end of the first groove, and wherein the first region includes an inclined area, and the second region has a region parallel to a lower surface of the plate portion.

9. The power conversion device according to claim 1, wherein the plate portion includes a plurality of radiating fins protruding outward from one surface and extending in one direction, and wherein a length direction of the first groove is the same as a length direction of the radiating fins.

10. The power conversion device according to claim 2, wherein the refrigerant pipe and the second groove are plural, and wherein the plurality of refrigerant pipes and the plurality of second grooves correspond to each other on a one-to-one basis.

11. The power conversion device according to claim 1, wherein the heat conduction portion overlaps a heating element in a vertical direction (Z direction).

12. The power conversion device according to claim 1, wherein a heating element is disposed in the housing, and wherein the heating element is in contact with the refrigerant pipe.

13. The power conversion device according to claim 1, wherein a protrusion protrudes upward from an upper surface of the cover, and accommodates the refrigerant pipe inside.

14. A power conversion device comprising:
a housing; and
a cover coupled to the housing,
wherein the cover includes:
a plate portion;
a heat conduction portion coupled to a lower surface of the plate portion; and
a refrigerant pipe,
wherein each of the plate portion and the heat conduction portion includes a groove for accommodating the refrigerant pipe,
wherein the plate portion includes a third groove in which a heat conduction portion is disposed, and
wherein the third groove includes a bottom surface, and the bottom surface includes an inclined region.

15. The power conversion device according to claim 14, wherein the plate portion includes a first groove in which the refrigerant pipe is disposed, and wherein the heat conduction portion includes a second groove in which the refrigerant pipe is disposed.

16. The power conversion device according to claim 15, wherein the first groove includes a bottom surface, and the bottom surface includes an inclined region.

17. The power conversion device according to claim 15, wherein the bottom surface of the second groove and the bottom surface of the first groove have the same slope.

18. A power conversion device comprising: a housing; and a cover coupled to the housing, the cover including: a plate portion; a top portion of a heat conduction portion coupled to a bottom surface of the plate portion; and a refrigerant pipe, wherein the bottom surface of the plate portion includes a first groove in which the refrigerant pipe is disposed, and wherein a bottom surface of the heat conduction portion includes a second groove in which the refrigerant pipe is disposed.

19. The power conversion device of claim 18, wherein the first groove and the second groove are coplanar.

20. The power conversion device of claim 18, wherein a first axial portion of the refrigerant pipe is disposed in the first groove, and wherein a second axial portion of the refrigerant pipe is disposed in the second groove, the second axial portion of the refrigerant pipe being different from the first axial portion of the refrigerant pipe.

* * * * *